United States Patent
Harlan et al.

(10) Patent No.: US 11,790,954 B1
(45) Date of Patent: Oct. 17, 2023

(54) CARRIER FOR HARD DRIVE

(71) Applicant: ZT Group Int'l, Inc., Secaucus, NJ (US)

(72) Inventors: Jared Harlan, Hutto, TX (US); Tung Yi Hsieh, Taoyuan (TW); Hsin Chiang Tan, New Taipei (TW); Yi-Chung Lin, New Taipei (TW); LungSheng Tsai, Austin, TX (US); Ryan Signer, Round Rock, TX (US)

(73) Assignee: ZT GROUP INT'L, INC., Secaucus, NJ (US)

( * ) Notice: Subject to any disclaimer, the term of this patent is extended or adjusted under 35 U.S.C. 154(b) by 0 days.

(21) Appl. No.: 17/935,266

(22) Filed: Sep. 26, 2022

(51) Int. Cl.
*H05K 5/02* (2006.01)
*G11B 33/02* (2006.01)

(52) U.S. Cl.
CPC ......... *G11B 33/022* (2013.01); *H05K 5/0208* (2013.01); *H05K 5/0221* (2013.01)

(58) Field of Classification Search
CPC ....................................................... H05K 5/00
See application file for complete search history.

(56) References Cited

U.S. PATENT DOCUMENTS

2019/0075668 A1* 3/2019 Adrian ................ G11B 33/128
2022/0408576 A1* 12/2022 Fawcett ............... H05K 5/0291

* cited by examiner

*Primary Examiner* — Jerry Wu
(74) *Attorney, Agent, or Firm* — POLSINELLI PC

(57) ABSTRACT

A carrier is provided for a hard drive. The carrier includes a housing that receives a hard drive and a security chip. A locking component secures the hard drive within the housing. Securing the locking component prevents the hard drive from being removed from the housing. A release mechanism releases the locking component. A breaking component is in communication with the release mechanism such that upon actuation of the release mechanism to release the locking component, the breaking component breaks the security chip for the hard drive.

20 Claims, 14 Drawing Sheets

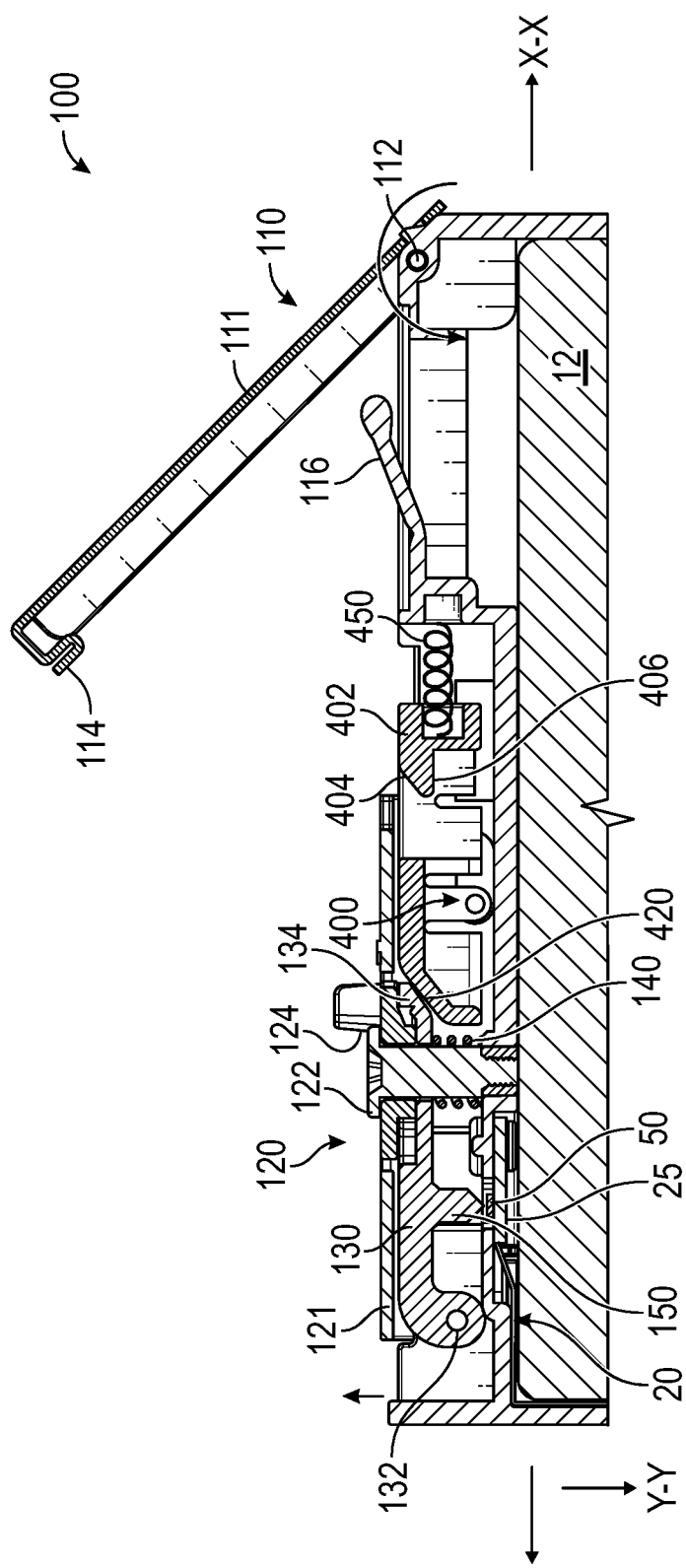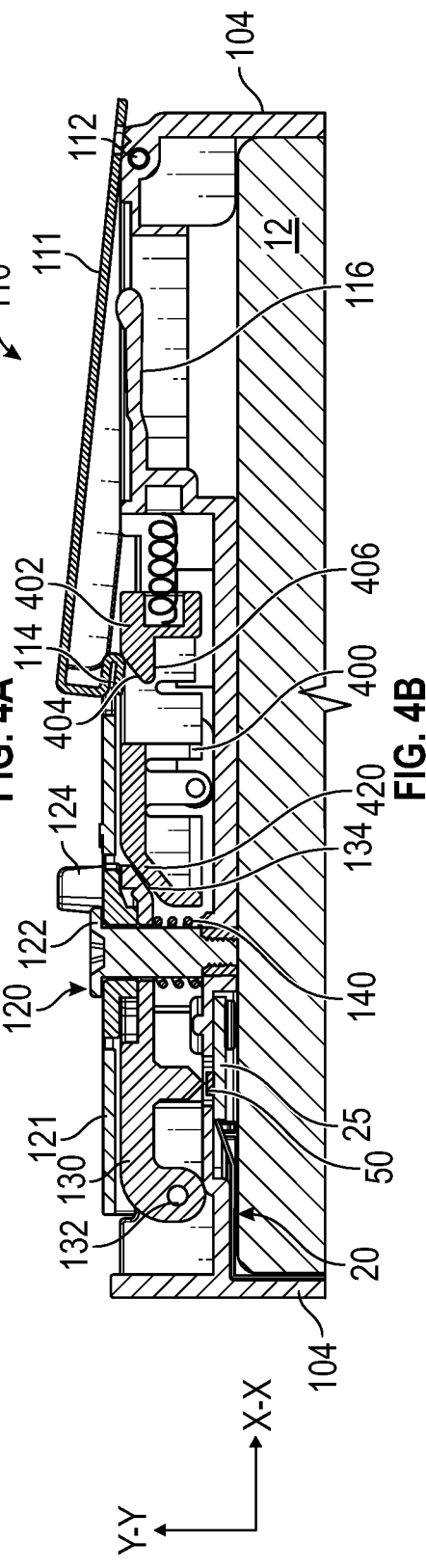
FIG. 4A
FIG. 4B

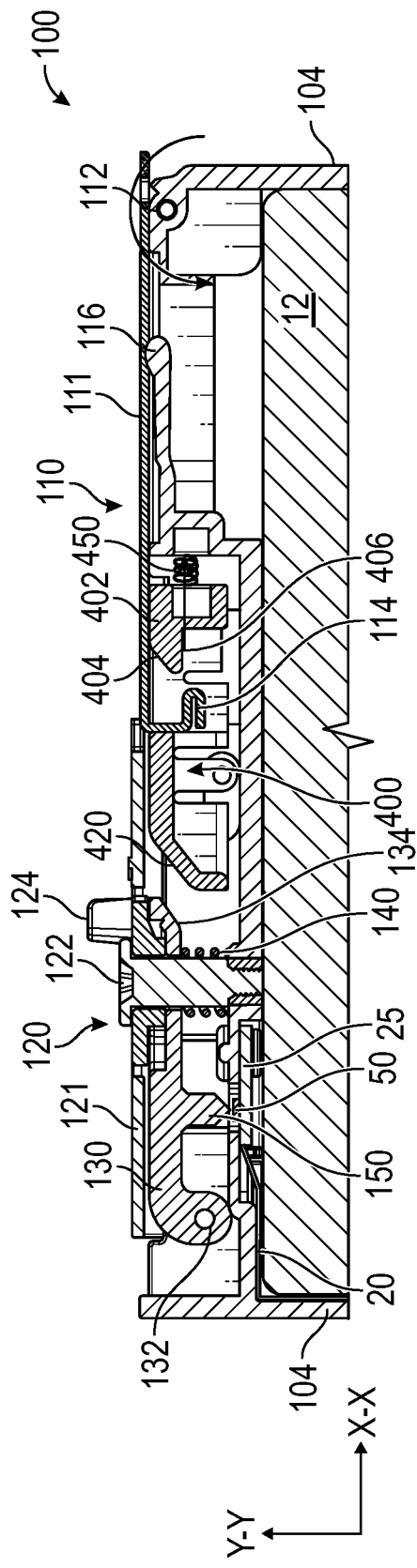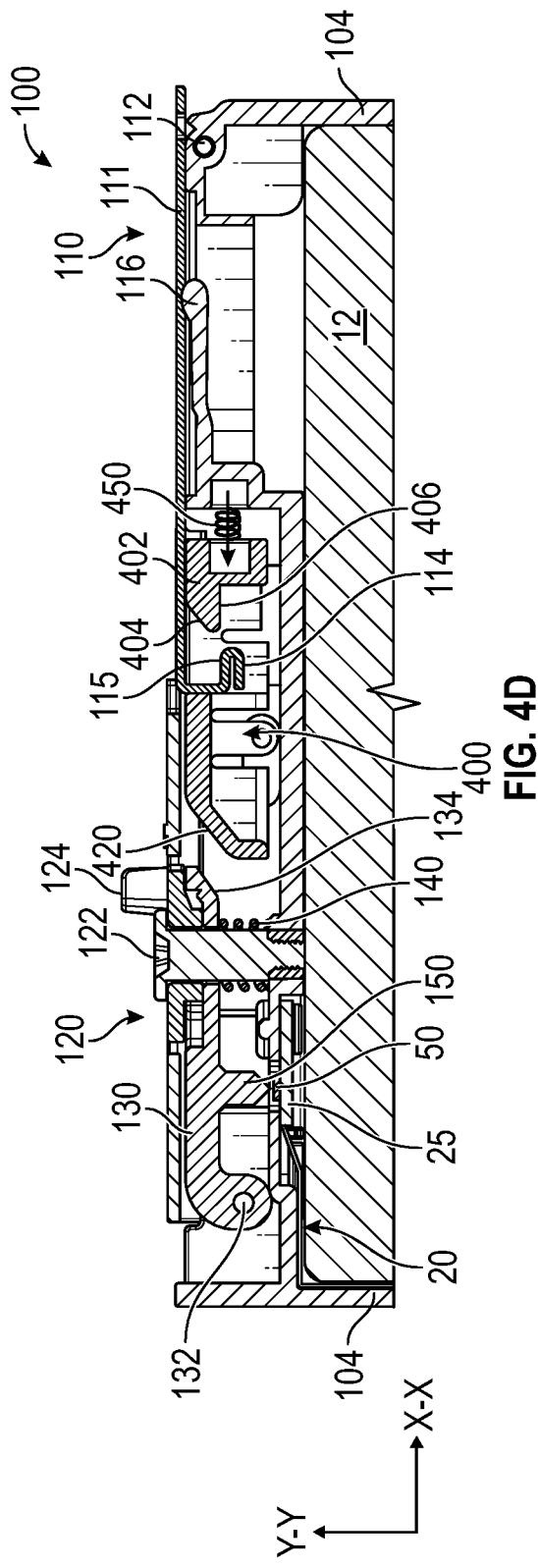

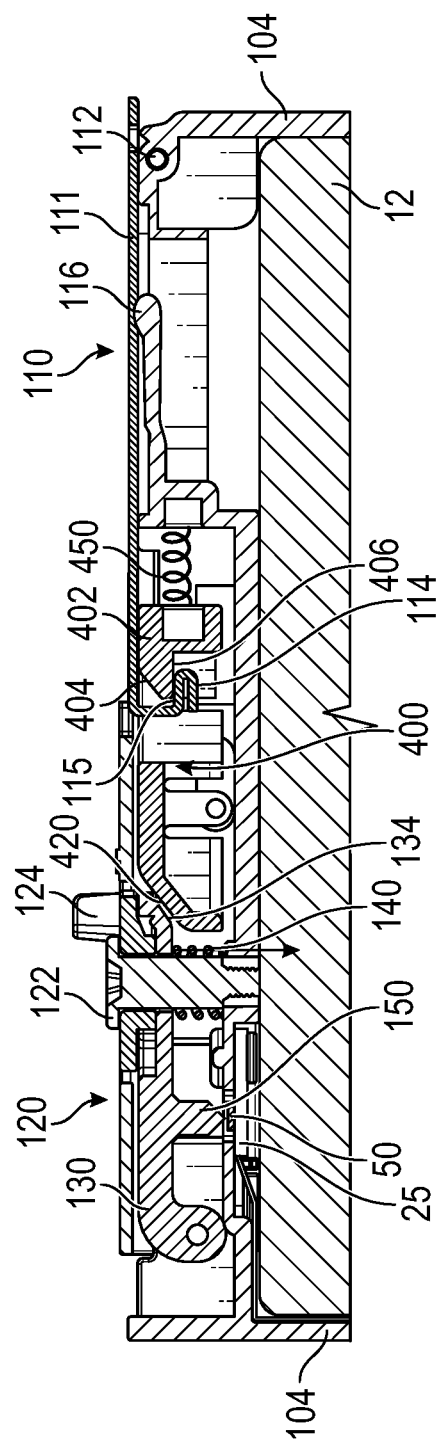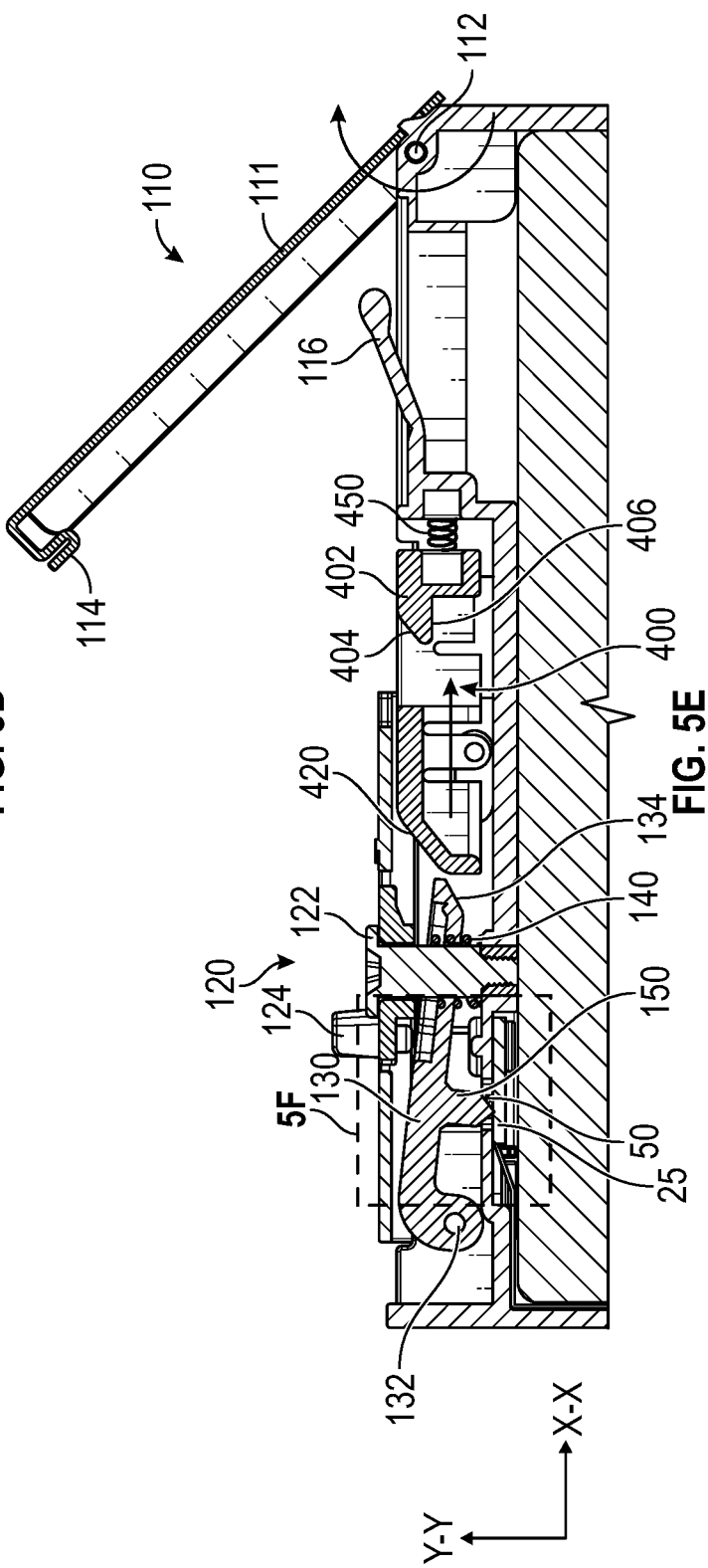

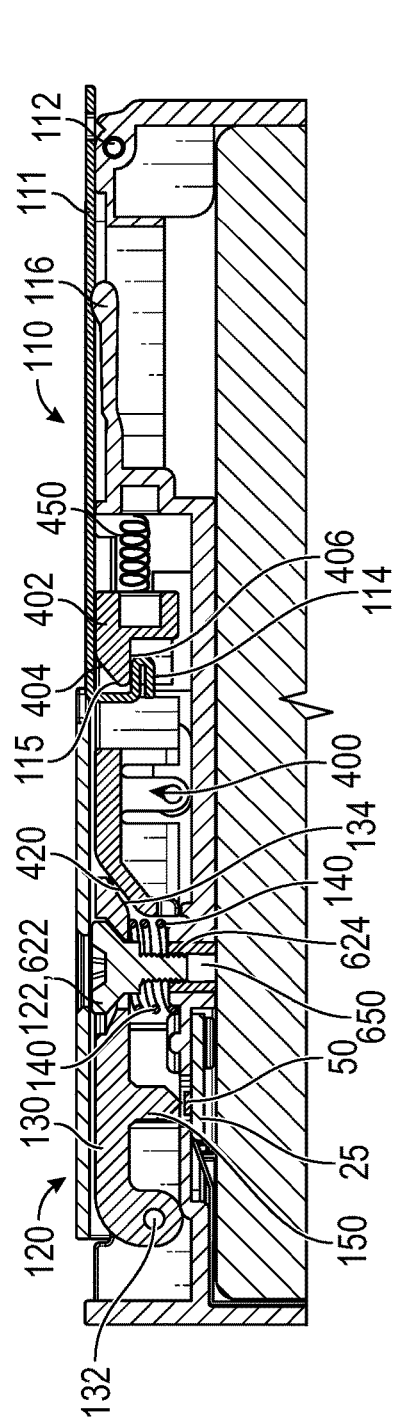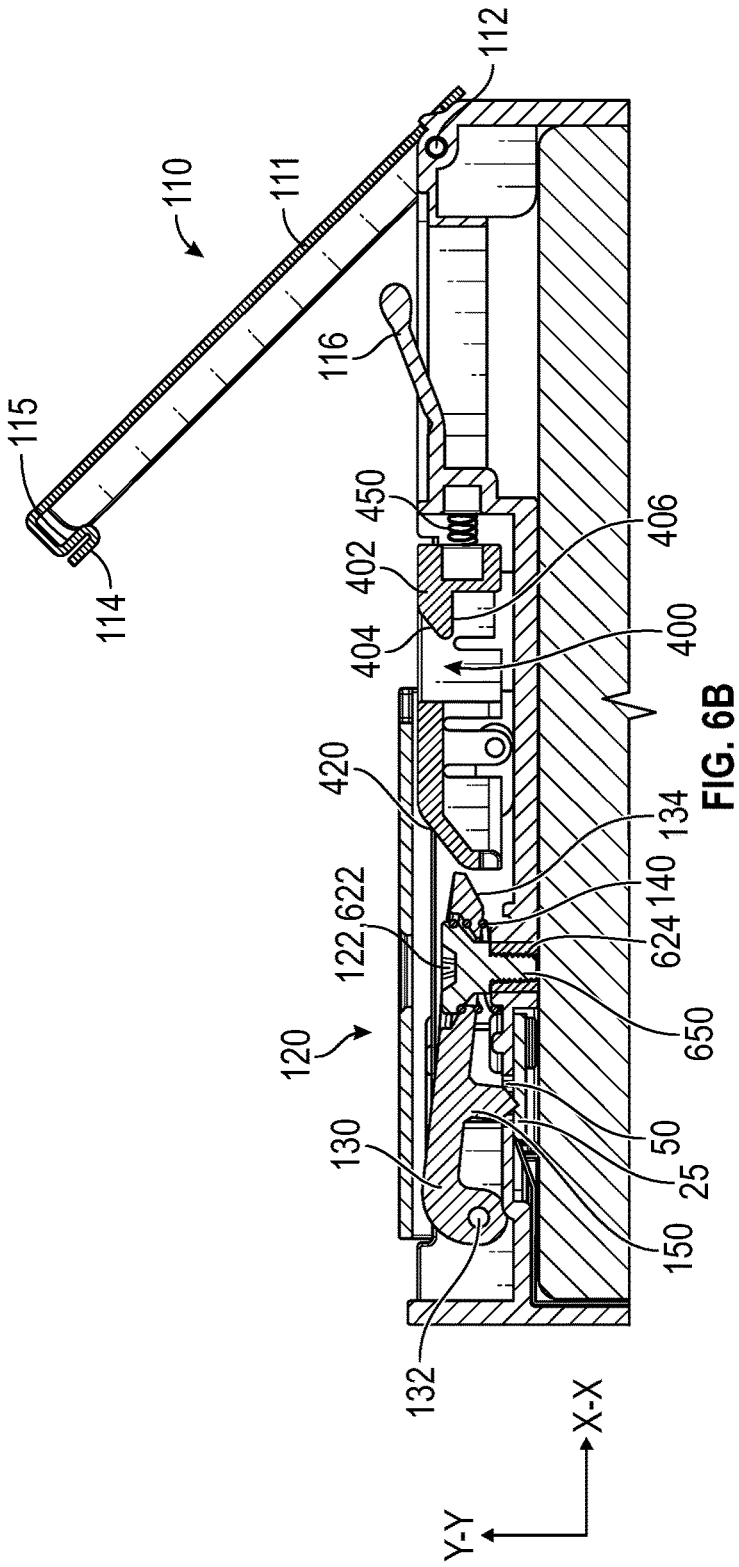

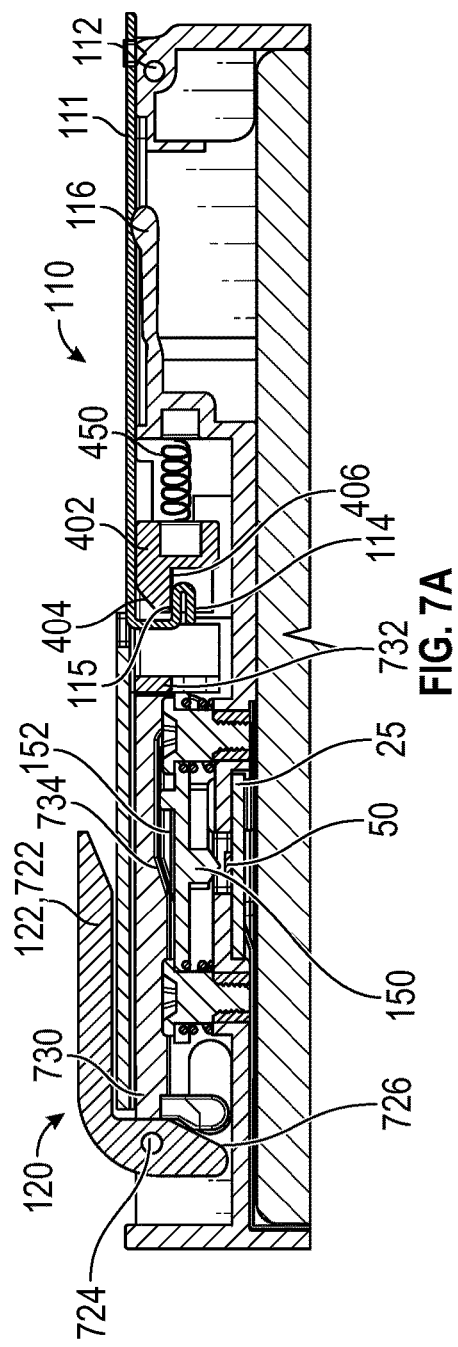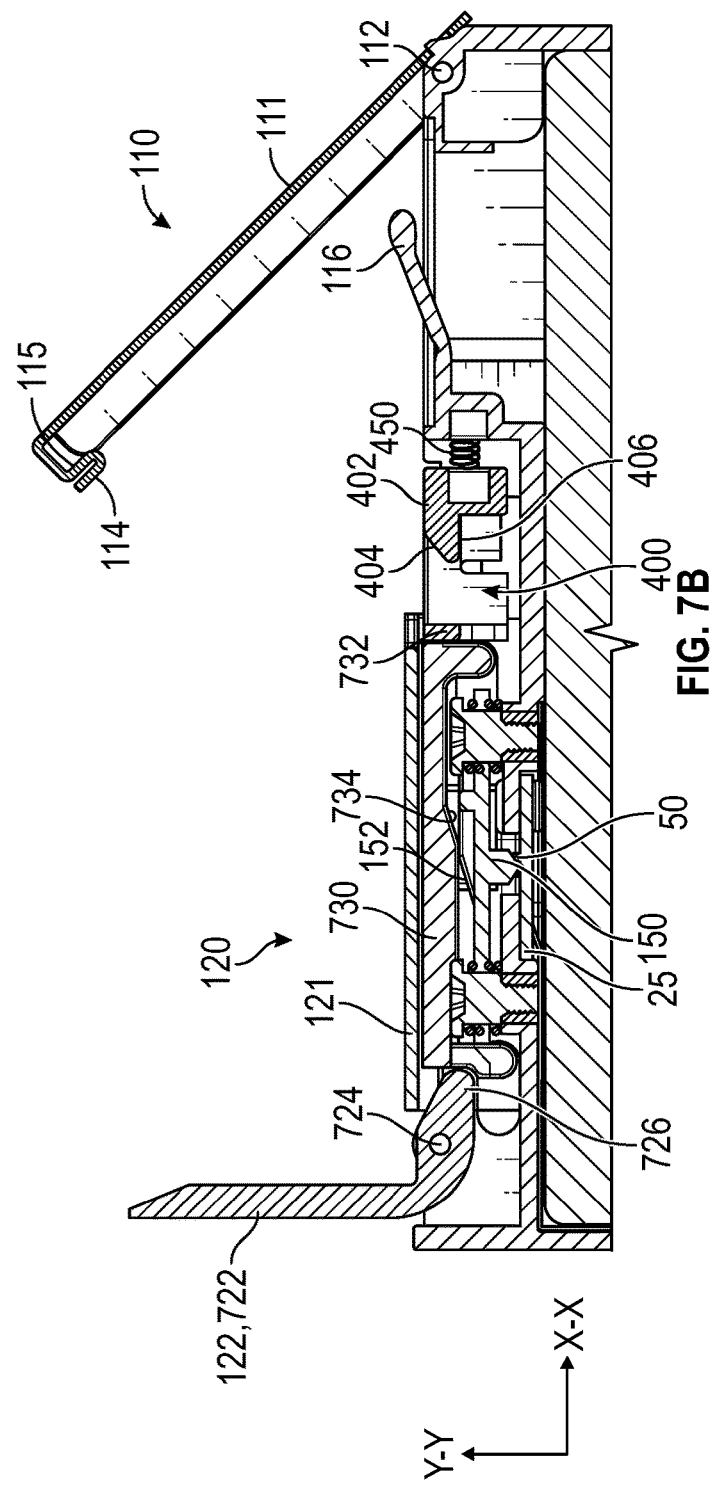

CARRIER FOR HARD DRIVE

FIELD

The present disclosure relates generally to a carrier for a hard drive operable to break a security chip.

BACKGROUND

Hard drives can be in communication with printed circuit boards which allow for communication with a computing system. The printed circuit board can include one or more security chips that are operable to provide access to the hard drive. The data stored in the hard drive may be encrypted. The security chip may be operable to decode the data being sent to the computing system. The security chip may be operable to encrypt data being sent to be stored in the hard drive. Communication with the hard drive would not be possible without the security chip. Accordingly, the hard drive is securely storing the data.

BRIEF DESCRIPTION OF THE DRAWINGS

Implementations of the present technology will now be described, by way of example only, with reference to the attached figures, wherein:

FIGS. 4A, 4B, 4C, 4D, and 4E are cross-sectional views of a portion of a carrier with a locking component transitioning from an open configuration to a secured configuration;

FIGS. 5A, 5B, 5C, 5D, 5E, and 5F illustrate the carrier with the release mechanism actuated to release the locking component to an open configuration and to break the security chip with the breaking component;

FIGS. 6A and 6B illustrate the carrier with another example of a release mechanism which is actuated to release the locking component to an open configuration and to break the security chip with the breaking component;

FIGS. 7A and 7B illustrate the carrier with another example of a release mechanism which is actuated to release the locking component to an open configuration and to break the security chip with the breaking component.

DETAILED DESCRIPTION

Figure 1:
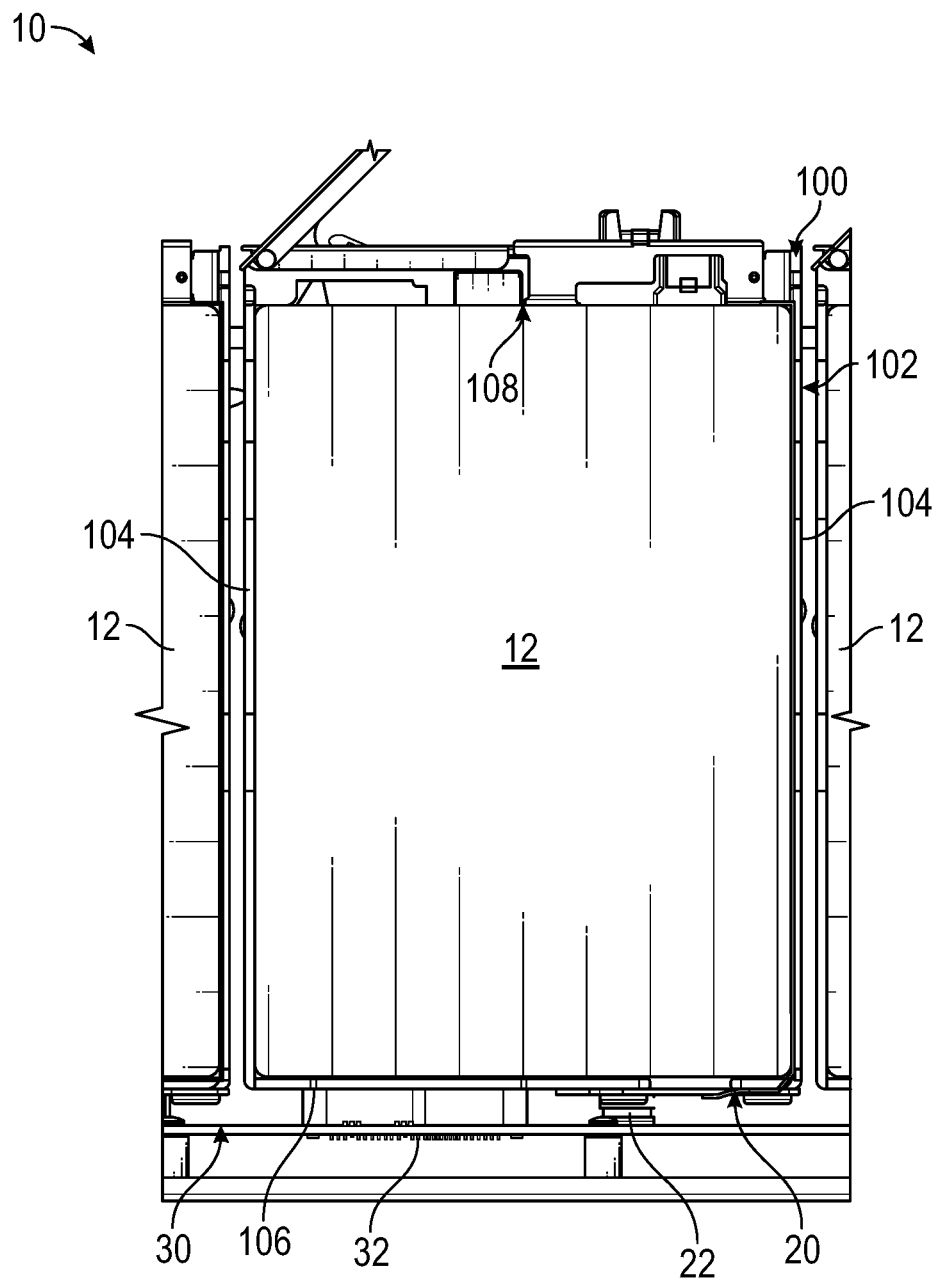
FIG. 1 is a perspective view of a hard drive system.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented. The term "coupled" is defined as connected, whether directly or indirectly through intervening components, and is not necessarily limited to physical connections. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "about" means reasonably close to the particular value. For example, about does not require the exact measurement specified and can be reasonably close. As used herein, the word "about" can include the exact number. The term "near" as used herein is within a short distance from the particular mentioned object. The term "near" can include abutting as well as relatively small distance beyond abutting. The terms "comprising," "including" and "having" are used interchangeably in this disclosure. The terms "comprising," "including" and "having" mean to include, but not necessarily be limited to the things so described.

Disclosed herein is a carrier for a hard drive. The carrier is operable to receive and secure the hard drive such that the hard drive is prevented from being removed. The carrier includes a locking component that secures the hard drive. The locking component can include a latch that closes to secure the hard drive within the carrier. A release mechanism can be actuated to release the locking component such that the hard drive can be removed from the carrier. However, upon actuation of the release mechanism, a breaking component in communication with the release mechanism breaks a security chip for the hard drive. Accordingly, the hard drive cannot be removed from the carrier without destroying and/or breaking the security chip, rendering the hard drive unusable as data from the hard drive cannot be decoded.

The disclosure now turns to FIG. 1, which illustrates an example of a hard drive system 10 to be used, for example, in a computing system such as a modular server and/or information handling system. The hard drive system 10 can include a hard drive 12 operable to store data such as an operating system, applications, files, documents, etc. The hard drive 12 can communicate with the rest of the computing system to provide data and/or store data. Each hard drive 12 can be received in a carrier 100. The carrier 100 can include a housing 102 operable to receive the hard drive 12 such that the hard drive 12 is secured in position. The carrier 100 can control the release and/or removal of the hard drive 12 from the hard drive system 10.

The hard drive 12 can be in communication with a printed circuit board 20. The printed circuit board 20 can be communicatively coupled with a motherboard 30. As illustrated in FIG. 1, the printed circuit board 20 can include a PCB connector 22 that couples the printed circuit board 20 with the motherboard 30. The motherboard 30 can include a computing connector 32 which couples that motherboard 30 with other components of the computing system, such as a processor, random access memory, etc.

In at least one example, as illustrated in FIG. 1, the hard drive system 10 can include a plurality of hard drives 12. Each of the hard drives 12 can be coupled with the motherboard 30. The hard drives 12 can be, for example, in series.

Figure 2:
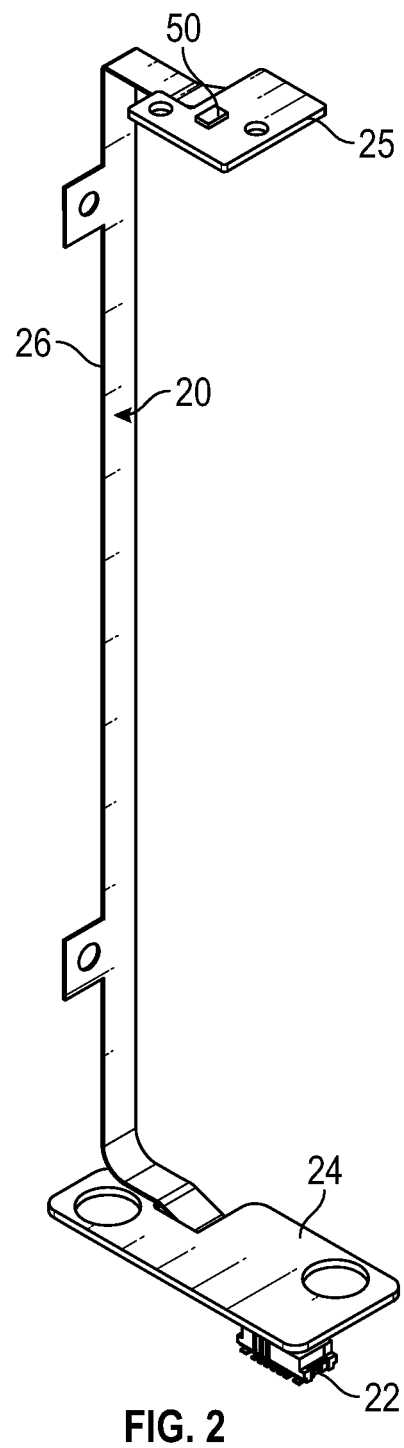
FIG. 2 is a perspective view of a printed circuit board.

FIG. 2 illustrates an example of the printed circuit board 20. The printed circuit board 20 includes a security chip 50 which is operable to control and/or provide access to the hard drive 12. The data stored in the hard drive 12 may be encrypted. The security chip 50 may be operable to decode the data being sent to the computing system and/or may be operable to encrypt data to be stored in the hard drive 12. As the data in the hard drive 12 is encrypted, communication with the hard drive 12 would not be possible without the security chip 50. Accordingly, the hard drive 12 is securely storing the data, and the security chip 20 providing the code to decode the data is necessary to access the hard drive 12.

Figure 3A:
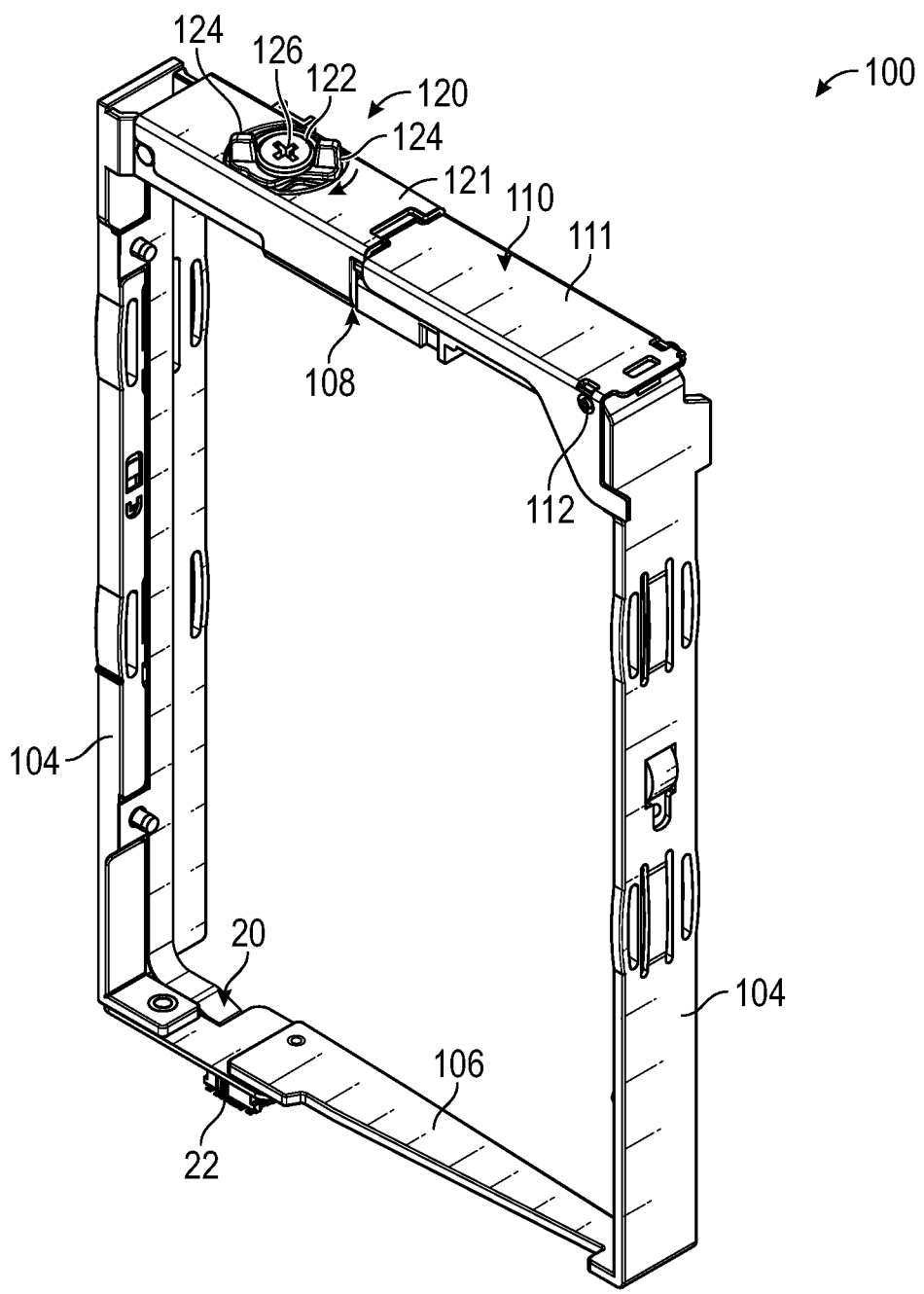
FIG. 3A is a perspective view of a carrier for a hard drive.
Figure 3B:
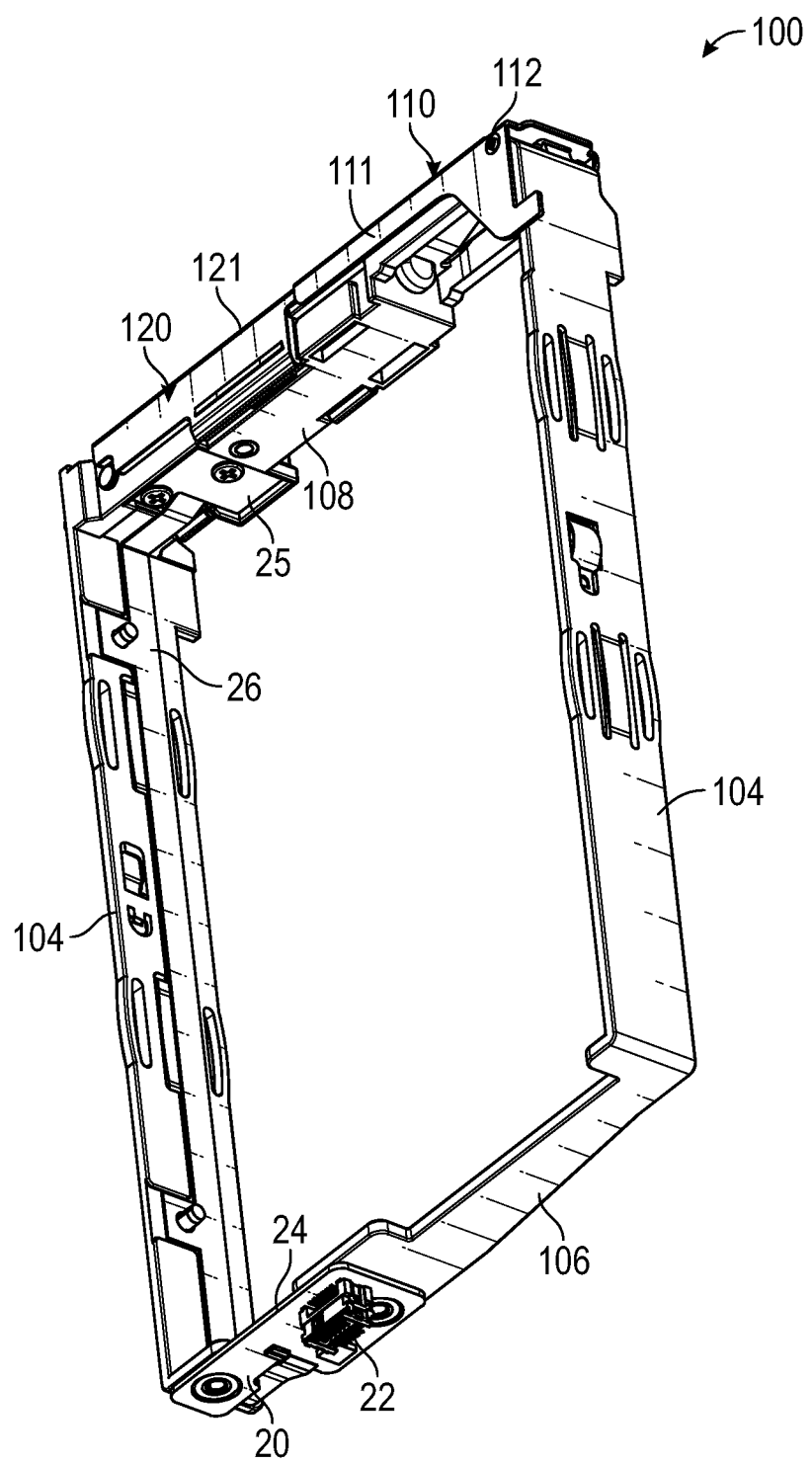
FIG. 3B is another perspective view of the carrier of FIG. 3A.

In at least one example, the security chip 50 is positioned on the printed circuit board 20 opposite the PCB connector 22 in relation to the hard drive 12. Accordingly, the security chip 50 can be communicatively coupled with the PCB connector 22 via a flexible printed circuit board. As illustrated in FIG. 2, the printed circuit board 20 can include a bottom portion 24 which includes the PCB connector 22, a top portion 25 which includes the security chip 50, and a side portion 26 which is operable to connect the top portion 25 and the bottom portion 24. Referring also to FIGS. 3A and 3B, the bottom portion 24 of the printed circuit board 20 can correspond with and/or be coupled with the bottom section 106 of the carrier 100, the side portion 26 can correspond with and/or be coupled with a side section 104 of the carrier 100, and the top portion 25 can correspond with and/or be coupled with the top section 108 of the carrier 100.

While the printed circuit board 20 as provided in the disclosure is a flexible printed circuit board, other configurations can be provided such as wired connection (e.g., cables and/or flexible cables) between the security chip 50 and the PCB connector 22 without deviating from the scope of the disclosure.

As illustrated in FIGS. 3A and 3B, the carrier 100 includes the housing 102 operable to receive the hard drive 12 and the security chip 50. A locking component 110 is operable to secure the hard drive 12 within the housing 12. Securing the locking component 110 prevents the hard drive 12 from being removed from the housing 102. As illustrated in FIGS. 3A and 3B, the locking component 110 can include a latch 111 that is operable to be transitioned from an open configuration to a closed configuration to secure the locking component 110. The latch 111 can be operable to pivot and/or rotate about a pivot pin 112.

A release mechanism 120 is operable to release the locking component 110. When the release mechanism 120 is actuated, the locking component 110 can be released and transitioned from the closed configuration (as illustrated in FIGS. 3A and 3B) to the open configuration (as shown in FIG. 4A). When the locking component 110 is in the open configuration, the hard drive 12 can be removed from the carrier 100.

As illustrated in FIGS. 3A and 3B, the locking component 110 and the release mechanism 120 are provided on the top section 108 of the carrier 100. As will be discussed in further detail below, the locking component 110 and the release mechanism 120 correspond with a breaking component 150 which is operable to break the security chip 50 upon actuation of the release mechanism 120. The hard drive 12 then cannot be removed from the carrier 100 without destroying the security chip 50 such that the security chip 50 is unable to be utilized to decode the data from the hard drive 12. To preserve sensitive data on the hard drive 12, the security chip 50 must be destroyed (e.g., render the security chip 50 unable to be utilized) before the hard drive 12 is removed from the carrier 100. This prevents access to the data outside of the proper functioning and design intent of the computing system.

Figure 4E:
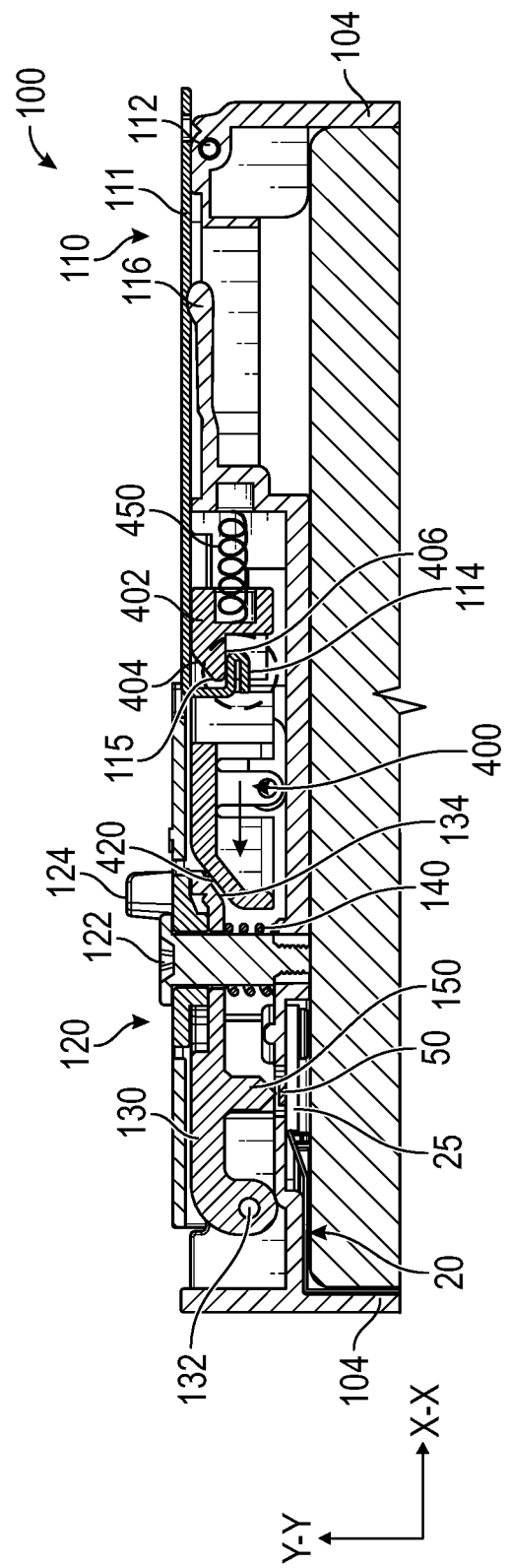
Figure 4F:
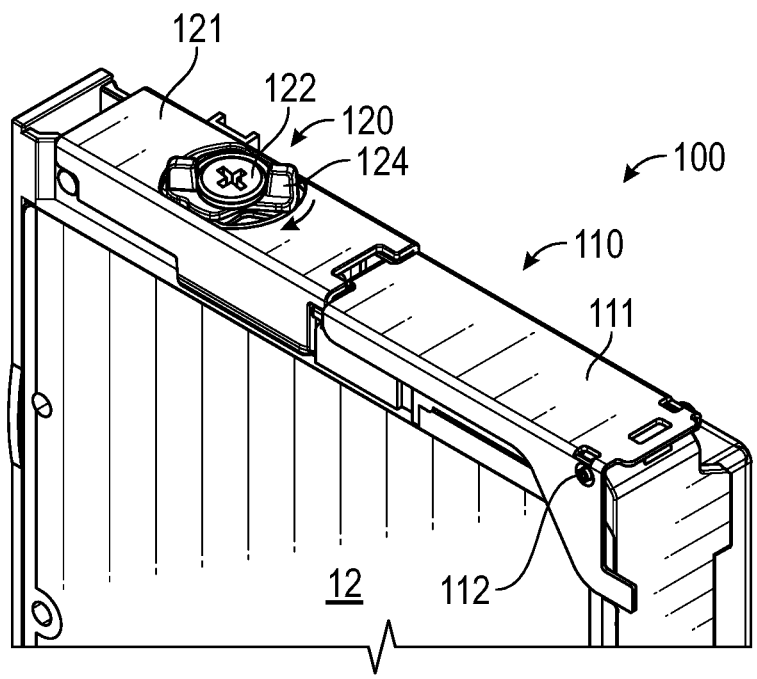
FIG. 4F is a perspective view of the carrier of FIGS. 4A-4E with the locking component in the secured configuration.

FIGS. 4A-4F illustrate the locking component 110 transitioning from the open configuration (e.g., as shown in FIG. 4A) to the closed configuration (e.g., as shown in FIGS. 4E and 4F) to secure the hard drive 12 within the carrier 100.

FIG. 4A illustrates the locking component 110 in the open configuration. The latch 111 is open such that at least one end of the locking component 110 (e.g., a catch 114) is separate from the housing 102. In at least one example, as illustrated in FIG. 4A, in the open configuration, a lift spring 116 is in an upright position. For example, the lift spring 116 is not under tension. The lift spring 116 is operable to push against the latch 111 when in the closed configuration such that when the locking component 110 is released, the lift spring 116 pushes the latch 111 towards the open configuration and away from the housing 102 of the carrier 100.

To transition the latch 111 to the closed configuration, as illustrated in FIGS. 4A and 4B, the latch 111 can be rotated about the pivot pin 112 to bring the catch 114 towards the housing 102 of the carrier 100. As illustrated in FIG. 4B, the catch 114 abuts against a receiving component 402 of a slider 400.

As illustrated in FIGS. 4B and 4C, the catch 114 abuts against an angled surface 404 of the receiving component 402 of the slider 400, and as the catch 114 continues down towards the closed configuration (e.g., along a perpendicular axis Y-Y), the catch 114 slides down the angled surface 404. As the catch 114 slides down the angled surface 404, the force of the catch 114 against the angled surface 404 causes the slider 400 to translate along a longitudinal axis X-X. In at least one example, as illustrated in FIG. 4C, as the slider 400 translates along the longitudinal axis X-X, a push spring 450 abutting against an end of the slider 400 can be compressed.

As illustrated in FIG. 4D, when the catch 114 is moved past the angled surface 404 of the receiving component 402 of the slider 400, the catch 114 is no longer exerting a force against the slider 400. The push spring 450 pushes back on the slider 400 such that the slider 400 translates in an opposing direction along the longitudinal axis X-X as when the catch 114 was causing the slider 400 to translate.

As illustrated in FIG. 4E, the push spring 450 causes the slider 400 and subsequently the receiving component 402 of the slider 400 to translate along the longitudinal axis X-X until a locking surface 406 of the receiving component 402 receives the catch 114. For example, the locking surface 406 is positioned above the catch 114 (e.g., the catch 114 is between the locking surface 406 and the hard drive 12) such that the catch 114 cannot be lifted along the perpendicular axis Y-Y (substantially perpendicular to the longitudinal axis X-X) until the receiving component 402 and the locking surface 406 is removed. Accordingly, the locking component 110 is in a closed and locked configuration, and the hard drive 12 cannot be removed from the housing 102 of the carrier 100. FIG. 4F illustrates the locking component 110 in the closed configuration. When the catch 114 is received by the receiving component 402 of the slider 400, the catch 114 is prevented from being released from the receiving component 402 until the slider 400 translates along the longitudinal axis X-X (as shown in FIGS. 5A-5F).

While the disclosure discusses the latch 111 of the locking component 110 pivoting about the pivot pin 112, the latch 111 can also translate, be lifted off, or be moved by any other mechanism without deviating from the scope of the disclosure. However, the locking component 110 should interact with and work in conjunction with the release mechanism 120 and the breaking component 150 such that the locking component 110 cannot be opened or released without breaking the security chip 50. Accordingly, the hard drive 12 cannot be removed from the carrier 100 without breaking the security chip 50 to safely ensure that the hard drive 12 cannot be accessed or utilized outside of the proper functioning and design intent of the system.

FIGS. 5A-5F illustrate the release mechanism 120 releasing the locking component 110 while the breaking component 150 breaks the security chip 50 (e.g., causes the security chip 50 to be unusable).

Figure 5A:
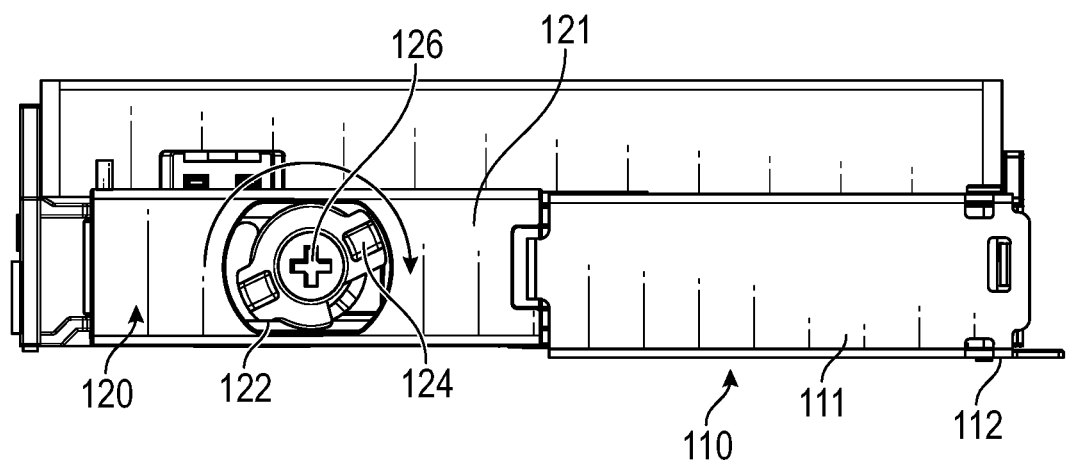
Figure 5B:
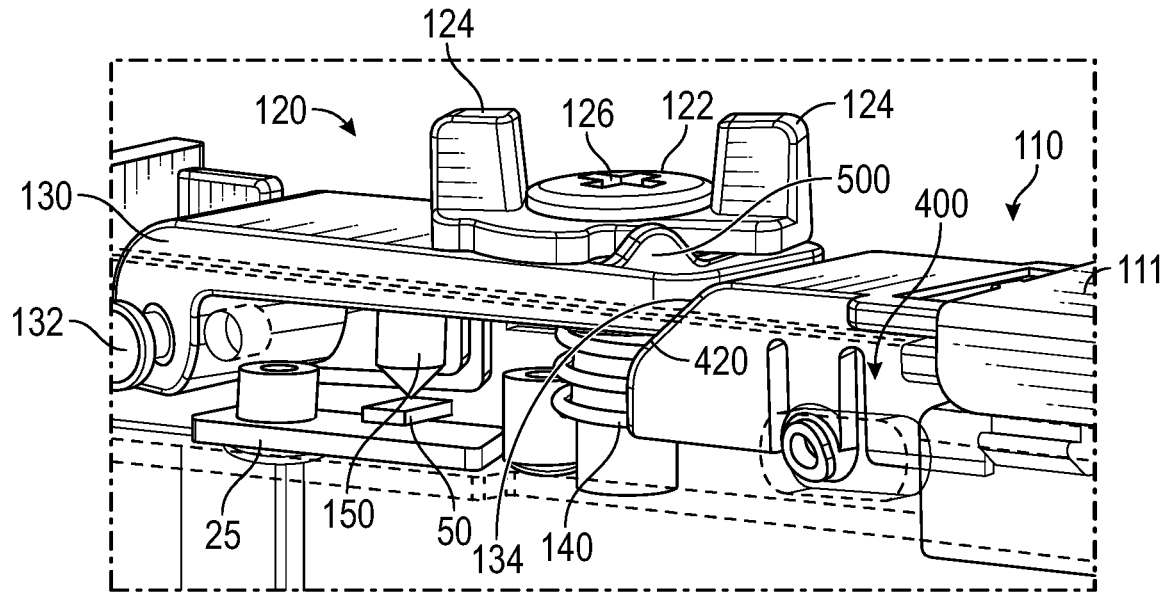
Figure 5C:
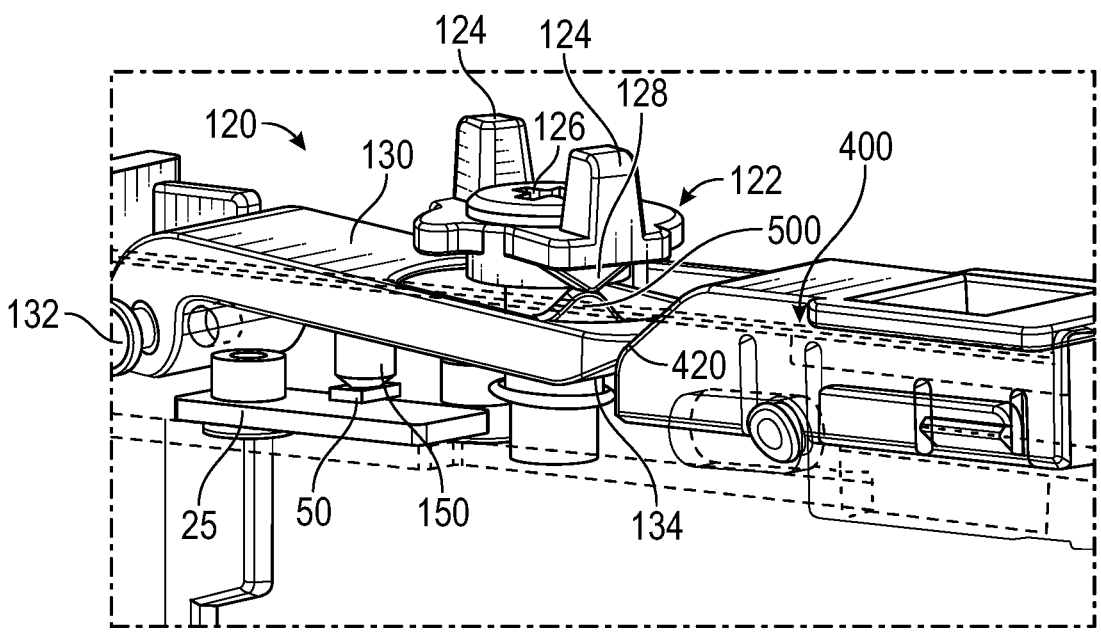

In at least one example, as illustrated in FIGS. 5A, 5B, and 5C, the release mechanism 120 can be rotated to release the locking component 110. As shown in FIGS. 5A-5F, the release mechanism 120 can include a wing nut 122 operable to be rotated to release the locking component 110. In at least one example, the wing nut 122 can include one or more finger surfaces 124 that can be raised such that a user's fingers can push against the finger surface(s) 124 to rotate the wing nut 122. In at least one example, the wing nut 122 can include a drive 126 which can be operable to receive a tool such as a screwdriver to cause the wing nut 122 to rotate.

The rotation of the wing nut 122 can actuate the release mechanism 120. As illustrated in FIGS. 5B and 5D, the wing nut 122 has not been rotated, and the release mechanism 120 has not been actuated. Accordingly, the catch 114 of the locking component 110 is still received by the receiving component 402 of the slider 400.

As illustrated in FIGS. 5C and 5E, the actuation of the release mechanism 120 can cause a lever 130 to pivot about a pivot point 132. When the lever 130 pivots due to the actuation of the release mechanism 120, the lever 130 moves substantially downwards (e.g., along the perpendicular axis Y-Y towards the hard drive 12). As shown in FIGS. 5B and 5C, the lever 130 can include a raised portion 500. The raised portion 500 can extend from the lever 130 such that the raised portion 500 is higher than the rest of the lever 130. Accordingly, when the wing nut 122 of the release mechanism 120 rotates, the wing nut 122 is operable to abut against and push against the raised portion 500 of the lever 130. In at least one example, the raised portion 500 can include at least one slope such that as the wing nut 122 abuts and pushes against the raised portion 130, the lever 130 is pushed downwards to pivot about the pivot point 132.

In at least one example, the lever 130 can include a slanted surface 134 which corresponds with a sloped surface 420 of the slider 400. When the lever 130 pivots downwards, the slanted surface 134 is operable to slide along the sloped surface 420 of the slider 400 causing the slider 400 to translate along the longitudinal axis X-X and release the catch 114 of the locking component 110. In at least one example, as the slanted surface 134 pushes against and slides against the sloped surface 420, the slider 400 translates along the longitudinal axis X-X and compresses the push spring 450. The receiving component 402 of the slider 400 also translates along the longitudinal axis X-X with the slider 400 such that the locking surface 406 is not positioned above the catch surface 115 of the catch 114. As the catch 114 is released, the latch 111 can be lifted and/or the lift spring 116 can push the latch 111 open. Accordingly, the locking component 110 is transitioned to the open configuration and the hard drive 12 can be removed.

Figure 5F:
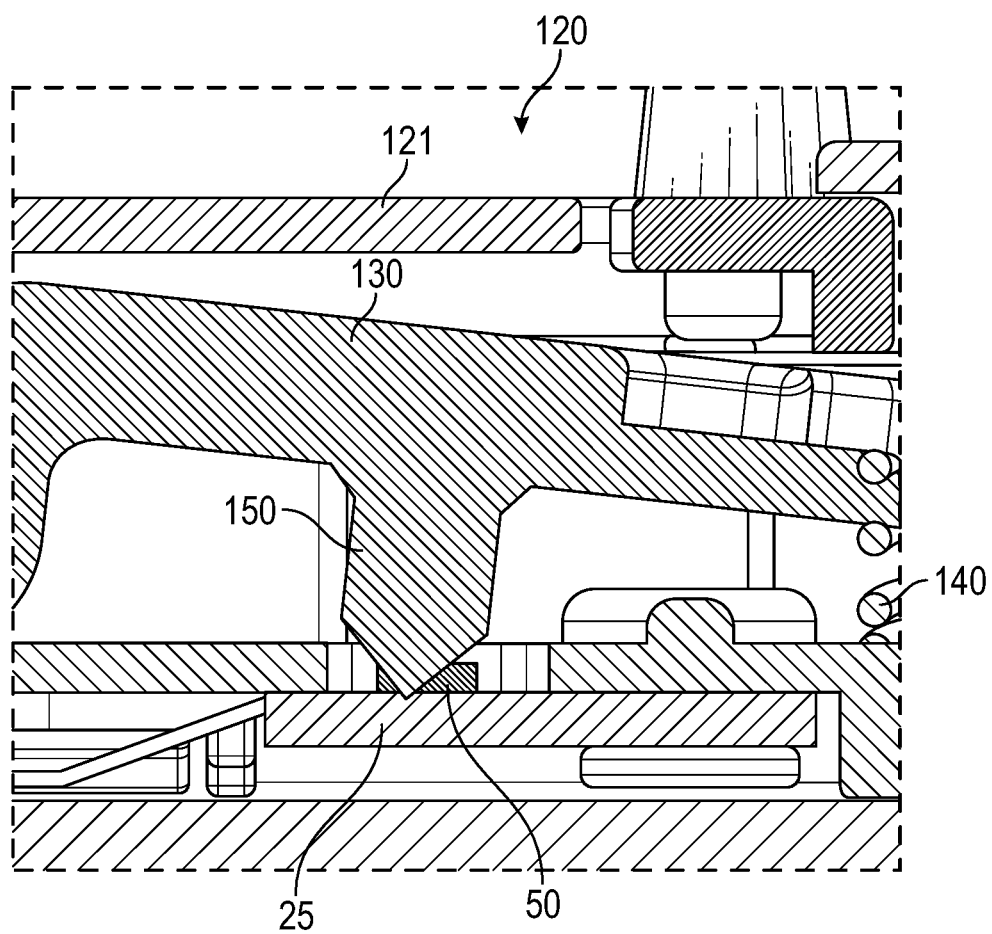

As illustrated in FIGS. 5C, 5E, and 5F, the breaking component 150 can be coupled to and/or integrated with the lever 130. When the lever 130 pivots downwards, the breaking component 150 moves substantially along the perpendicular axis Y-Y and enacts a breaking force onto the security chip 50 to break the security chip 50. Accordingly, the breaking component 150 is in communication with the release mechanism 120 such that upon actuation of the release mechanism 120 to release the locking component 110, the breaking component 150 is operable to break the security chip 50 for the hard drive 12. In at least one example, the breaking force can be at least 25 pounds. In at least one example, the breaking force can be at least 40 pounds. In at least one example, the breaking force can be at least 50 pounds. The breaking force can be a threshold such that the security chip 50 is rendered unusable for coding and/or decoding data between the computing system and the hard drive 12.

With the actuation of the release mechanism 120, the slider 400 translates along the longitudinal axis X-X to release the catch 114 from the receiving component 402. Simultaneously and/or before releasing the catch 114, upon actuation of the release mechanism 120, the breaking component 150 is operable to break the security chip 50 for the hard drive 12. Accordingly, the hard drive 12 is securely received and/or locked in the carrier 100 and requires the breaking of the security chip 50 to be released.

FIGS. 6A and 6B illustrate an example of the release mechanism 120 including a screw component 622 instead of the wing nut 122. The screw component 622 can be rotated by a tool such as a screwdriver. The screw component 622 can include a threaded section 624 which is operable to be received by and interact with a corresponding thread section 650 of the release mechanism 120. As the screw component 622 is rotated, the threaded section 624 rotates in relation to the thread section 650, and the screw component 622 translates downwards along the perpendicular axis Y-Y (e.g., towards the hard drive 12). As the screw component 622 translates downwards, the lever 130 is pivots about the pivot point 132 such that the lever 130 moves substantially downwards along the perpendicular axis Y-Y.

In at least one example, the lever 130 can include a slanted surface 134 which corresponds with a sloped surface 420 of the slider 400. When the lever 130 pivots downwards, the slanted surface 134 is operable to slide along the sloped surface 420 of the slider 400 causing the slider 400 to translate along the longitudinal axis X-X and release the catch 114 of the locking component 110. In at least one example, as the slanted surface 134 pushes against and slides against the sloped surface 420, the slider 400 translates along the longitudinal axis X-X and compresses the push spring 450. The receiving component 402 of the slider 400 also translates along the longitudinal axis X-X with the slider 400 such that the locking surface 406 is not positioned above the catch surface 115 of the catch 114. As the catch 114 is released, the latch 111 can be lifted and/or the lift spring 116 can push the latch 111 open. Accordingly, the locking component 110 is transitioned to the open configuration and the hard drive 12 can be removed.

As illustrated in FIG. 6B, the breaking component 150 can be coupled to and/or integrated with the lever 130. Accordingly, when the lever 130 pivots downwards, the breaking component 150 moves substantially along the perpendicular axis Y-Y and enacts a breaking force onto the security chip 50 to break the security chip 50. Accordingly, the breaking component 150 is in communication with the release mechanism 120 such that upon actuation of the release mechanism 120 to release the locking component 110, the breaking component 150 is operable to break the security chip 50 for the hard drive 12. In at least one example, the breaking force can be at least 25 pounds. In at least one example, the breaking force can be at least 40 pounds. In at least one example, the breaking force can be at least 50 pounds. The breaking force can be a threshold such that the security chip 50 is rendered unusable for coding and/or decoding data between the computing system and the hard drive 12.

With the actuation of the release mechanism 120 (e.g., rotate the screw component 622), the slider 400 translates along the longitudinal axis X-X to release the catch 114 from the receiving component 402. Simultaneously and/or before releasing the catch 114, upon actuation of the release mechanism 120, the breaking component 150 is operable to break the security chip 50 for the hard drive 12. Accordingly, the hard drive 12 is securely received and/or locked in the carrier 100 and requires the breaking of the security chip 50 to be released.

FIGS. 7A and 7B illustrate an example of the release mechanism 120 including a lever arm 722 operable to be lifted to release the locking mechanism 110. In at least one example, the lever arm 722 can provide greater mechanical leverage in comparison to the wing nut 122 and/or the screw component 622.

The lever arm 722 can be operable to pivot about a lever pivot 724. The lever arm 722 can include on the opposing side of the lever pivot 724 an extension part 726. The extension part 726 can extend away from the lever pivot 724. Accordingly, when the lever arm 722 is lifted (e.g., pivoted about the lever pivot 724), the extension part 726 rotates and pushes against a pushing component 730 causing the pushing component 730 to translate along the longitudinal axis X-X (e.g., towards the locking component 110). As the pushing component 730 translates along the longitudinal axis X-X, the pushing component 730 can push to the slider 400 to translate along the longitudinal axis X-X in the same direction as the pushing component 730. As illustrated in FIG. 7B, the receiving component 402 of the slider 400 also translates along the longitudinal axis X-X with the slider 400 such that the locking surface 406 is not positioned above the catch surface 115 of the catch 114. As the catch 114 is released, the latch 111 can be lifted and/or the lift spring 116 can push the latch 111 open. Accordingly, the locking component 110 is transitioned to the open configuration and the hard drive 12 can be removed.

In at least one example, the pushing component 730 can include an angled surface 734 which corresponds with a ramp surface 152 provided on the breaking component 150. The angled surface 734 and the ramp surface 152 can be provided at an angle relative to the longitudinal axis X-X. Accordingly, when the pushing component 730 translates along the longitudinal axis X-X, the angled surface 734 slides along the ramp surface 152 causing the breaking component 150 to move along the perpendicular axis Y-Y and enact a force onto the security chip 50 to break the security chip 50. Accordingly, the breaking component 150 is in communication with the release mechanism 120 such that upon actuation of the release mechanism 120 to release the locking component 110, the breaking component 150 is operable to break the security chip 50 for the hard drive 12. In at least one example, the breaking force can be at least 25 pounds. In at least one example, the breaking force can be at least 40 pounds. In at least one example, the breaking force can be at least 50 pounds. The breaking force can be a threshold such that the security chip 50 is rendered unusable for coding and/or decoding data between the computing system and the hard drive 12.

With the actuation of the release mechanism 120 (e.g., lift the lever arm 722), the slider 400 translates along the longitudinal axis X-X to release the catch 114 from the receiving component 402. Simultaneously and/or before releasing the catch 114, upon actuation of the release mechanism 120, the breaking component 150 is operable to break the security chip 50 for the hard drive 12. Accordingly, the hard drive 12 is securely received and/or locked in the carrier 100 and requires the breaking of the security chip 50 to be released.

Figure 8:
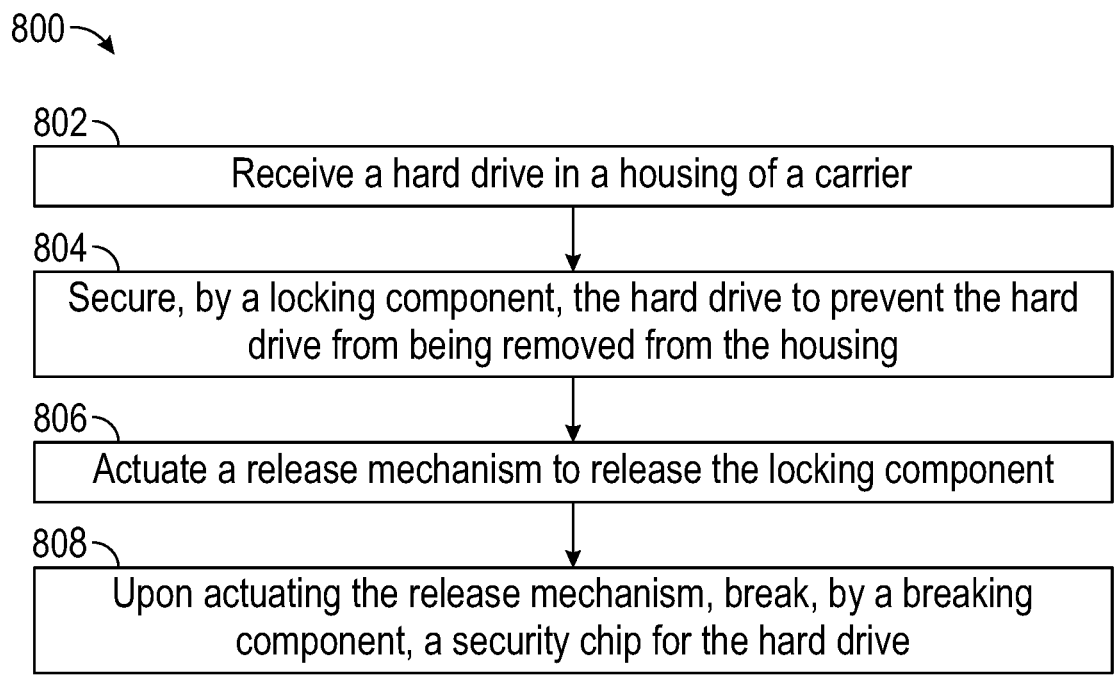
FIG. 8 is a flow chart of a method for securely storing a hard drive.

Referring to FIG. 8, a flowchart is presented in accordance with an example embodiment. The method 800 is provided by way of example, as there are a variety of ways to carry out the method. The method 800 described below can be carried out using the configurations illustrated in FIG. 1-7B, for example, and various elements of these figures are referenced in explaining example method 800. Each block shown in FIG. 8 represents one or more processes, methods or subroutines, carried out in the example method 800. Furthermore, the illustrated order of blocks is illustrative only and the order of the blocks can change according to the present disclosure. Additional blocks may be added or fewer blocks may be utilized, without departing from this disclosure. The example method 800 can begin at block 802.

At block 802, a hard drive is received in a housing of a carrier.

At block 804, the hard drive is secured by a locking component to prevent the hard drive from being removed from the housing.

At block 806, a release mechanism is actuated to release the locking component. After the locking component is released, the hard drive can be removed from the carrier.

At block 808, upon actuating the release mechanism, a breaking component breaks a security chip for the hard drive. Accordingly, the security chip is broken before the hard drive can be removed.

The embodiments shown and described above are only examples. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure to the full extent indicated by the broad general meaning of the terms used in the attached claims. It will therefore be appreciated that the embodiments described above may be modified within the scope of the appended claims.

What is claimed is:

1. A carrier for a hard drive, the carrier comprising: a housing operable to receive a hard drive and a security chip; a locking component operable to secure the hard drive within the housing, wherein securing the locking component prevents the hard drive from being removed from the housing; a release mechanism operable to release the locking component so that the hard drive can be removed from the housing; and a breaking component in communication with the release mechanism, wherein upon actuation of the release mechanism to release the locking component, the breaking component is operable to break the security chip for the hard drive the security chip is unable to be utilized to decode encrypted data from the HD.

2. The carrier of claim 1, wherein the locking component includes a latch that is transitioned to a closed configuration to secure the locking component.

3. The carrier of claim 2, wherein when the latch is transitioning to the closed configuration, a catch is operable to be received by a receiving component of a slider such that the catch is prevented from being released from the receiving component until the slider translates along a longitudinal axis.

4. The carrier of claim 3, wherein the actuation of the release mechanism causes the slider to translate along the longitudinal axis to release the catch from the receiving component.

5. The carrier of claim 4, wherein the actuation of the release mechanism causes a lever to pivot about a pivot point, wherein the breaking component is coupled to and/or integrated with the lever, wherein when the lever pivots, the breaking component moves substantially along a perpendicular axis and enacts a force onto the security chip to break the security chip.

6. The carrier of claim 5, wherein the lever includes a slanted surface corresponding with a sloped surface of the slider, wherein when the lever pivots, the slanted surface slides along the sloped surface causing the slider to translate along the longitudinal axis and release the catch.

7. The carrier of claim 4, wherein the actuation of the release mechanism causes a pushing component to translate and push the slider to translate along the longitudinal axis, wherein the pushing component includes an angled surface corresponding with a ramp surface of the breaking component, wherein when the pushing component translates along the longitudinal axis, the breaking component moves along a perpendicular axis and enacts a force onto the security chip to break the security chip.

8. The carrier of claim 1, wherein the release mechanism includes a wing nut operable to be rotated to release the locking component.

9. The carrier of claim 1, wherein the release mechanism includes a screw component operable to be rotated by a screwdriver to release the locking mechanism.

10. The carrier of claim 1, wherein the release mechanism includes a lever arm operable to be lifted to release the locking mechanism.

11. A hard drive system comprising: a hard drive; a printed circuit board in communication with the hard drive, the printed circuit board including a security chip operable to provide access to the hard drive; and a carrier including: a housing operable to receive the hard drive and the security chip; a locking component operable to secure the hard drive within the housing, wherein securing the locking component prevents the hard drive from being removed from the housing; a release mechanism operable to release the locking component so that the hard drive can be removed from the housing; and a breaking component in communication with the release mechanism, wherein upon actuation of the release mechanism to release the locking component, the breaking component is operable to break the security chip for the hard drive the security chip is unable to be utilized to decode encrypted data from the HD.

12. The hard drive system of claim 11, wherein the locking component includes a latch that is transitioned to a closed configuration to secure the locking component, wherein when the latch is transitioning to the closed configuration, a catch is operable to be received by a receiving component of a slider such that the catch is prevented from being released from the receiving component until the slider translates along a longitudinal axis.

13. The hard drive system of claim 12, wherein the actuation of the release mechanism causes the slider to translate along the longitudinal axis to release the catch from the receiving component.

14. The hard drive system of claim 13, wherein the actuation of the release mechanism causes a lever to pivot about a pivot point, wherein the breaking component is coupled to and/or integrated with the lever, wherein when the lever pivots, the breaking component moves substantially along a perpendicular axis and enacts a force onto the security chip to break the security chip.

15. The hard drive system of claim 14, wherein the lever includes a slanted surface corresponding with a sloped surface of the slider, wherein when the lever pivots, the slanted surface slides along the sloped surface causing the slider to translate along the longitudinal axis and release the catch.

16. The hard drive system of claim 13, wherein the actuation of the release mechanism causes a pushing component to translate and push the slider to translate along the longitudinal axis, wherein the pushing component includes an angled surface corresponding with a ramp surface of the breaking component, wherein when the pushing component translates along the longitudinal axis, the breaking component moves along a perpendicular axis and enacts a force onto the security chip to break the security chip.

17. The hard drive system of claim 11, wherein the security chip is provided on a flexible printed circuit board.

18. The hard drive system of claim 11, wherein the security chip is coupled with one or more flexible cables.

19. The hard drive system of claim 11, wherein the release mechanism includes at least one of the following: a wing nut operable to be rotated to release the locking mechanism, a screw component operable to be rotated by a screwdriver to release the locking mechanism, and/or a lever arm operable to be lifted to release the locking mechanism.

20. A method comprising: receiving a hard drive in a housing of a carrier; securing, by a locking component, the hard drive to prevent the hard drive from being removed from the housing; actuating a release mechanism to release the locking component so that the hard drive can be removed from the housing; upon actuating the release mechanism, breaking, by a breaking component, a security chip for the hard drive the security chip is unable to be utilized to decode encrypted data from the HD.

* * * * *